(12) United States Patent
Schumacher et al.

(10) Patent No.: US 6,374,627 B1
(45) Date of Patent: Apr. 23, 2002

(54) DATA CENTER COOLING SYSTEM

(76) Inventors: Donald J. Schumacher, 3564 Woodridge Pl., Palm Harbor, FL (US) 34684; William C. Beckman, 2211 S. Terrace Blvd., Longwood, FL (US) 32779

(*) Notice: Subject to any disclaimer, the term of this patent is extended or adjusted under 35 U.S.C. 154(b) by 0 days.

(21) Appl. No.: 09/681,105

(22) Filed: Jan. 9, 2001

(51) Int. Cl.[7] ............................................. F25D 17/06
(52) U.S. Cl. ................... 62/259.2; 62/263; 165/104.33
(58) Field of Search ............................. 62/259.2, 263; 165/80.3, 104.33; 361/691

(56) References Cited

U.S. PATENT DOCUMENTS

| | | | | |
|---|---|---|---|---|
| 5,467,607 A | * | 11/1995 | Harvey | 62/186 |
| 5,467,609 A | * | 11/1995 | Feeney | 62/259.2 |
| 5,657,641 A | * | 8/1997 | Cunningham et al. | 62/263 |
| 5,934,368 A | * | 8/1999 | Tanaka et al. | 165/233 |
| 6,011,688 A | * | 1/2000 | Thornburg et al. | 361/695 |

FOREIGN PATENT DOCUMENTS

| | | | | |
|---|---|---|---|---|
| JP | 6-159729 | * | 6/1994 | 62/259.2 |
| JP | 6-159730 | * | 6/1994 | 62/259.2 |

* cited by examiner

Primary Examiner—Denise L. Esquivel
Assistant Examiner—Melvin Jones
(74) Attorney, Agent, or Firm—Ronald E. Smith; Smith & Hopen, P.A.

(57) ABSTRACT

A data center having multiple rows of computer racks for holding heat-generating computer equipment is cooled by a liquid overfeed air conditioning unit that provides supply air at a temperature of about forty degrees Fahrenheit (40° F. or lower). The air conditioning unit is positioned outside the data center. Ducting from the heat exchanger outlet of the unit is connected to supply registers mounted in aisles that are provided between the rows of computer racks so that very cold supply air enters the space between the racks. Each computer rack includes vertically spaced compartments that house computer components to be cooled. At least one circulation fan is associated with each compartment and causes supply air to flow through the compartment to cool the components. The supply air gradually warms as it flows through successive compartments and is approximately 72° Fahrenheit when it reaches a return register in the ceiling of the data center. The use of a high temperature differential conserves energy, reduces noise, increases usable data center floor space, and maintains proper data system component operating temperatures.

3 Claims, 5 Drawing Sheets

DATA CENTER COOLING SYSTEM

BACKGROUND OF INVENTION

1. Field of the Invention

This invention relates, generally, to highly efficient air conditioning systems for data centers. More particularly, it relates to a system that includes a liquid overfeed air conditioning unit that supplies conditioned air to the data center at temperatures of forty-five degrees Fahrenheit and below.

2. Description of the Prior Art

Data centers are buildings that house large numbers of file servers, data processors, or other heat-generating computer components. Typically, the interior of a data center is filled with multiple rows of cabinet-like equipment called racks that are arranged in parallel relation to one another throughout the entire extent of the data center. An aisle for service personnel is provided between each row of racks and at each end of the building. Each rack houses multiple, vertically spaced components. In this way, a very large number of file servers or other components can be placed in a data center.

The heat collectively generated by very large numbers of densely packed components within a data center is sufficient to cause catastrophic failure of the file servers. Accordingly, even the earliest data centers were air conditioned twenty four hours per day, every day of the year. These early data centers utilized common window units, but these proved inadequate as computer componentd evolved and consumed higher levels of energy, thereby creating more heat.

Modern data centers employ packaged chilled water or direct expansion (DX) air conditioning units positioned inside the data center. Such units represent a substantial improvement over window units but they have a number of drawbacks. For example, they are placed inside the data center and thus reduce the number of racks that can be housed therein. Moreover, they cool the supply air to about fifty five degrees. This type of cooling was acceptable before components were packed as densely as they are today. Many densely populated data centers throughout the world have components that are now operating under thermal stress, or very near their highest acceptable operating temperatures. As data centers are being converted or renovated to house as many components as possible at the greatest possible density, it is clear that a revolutionary new way of cooling data centers is required.

However, even though the data center industry is alarmed over the current situation, and has been for several years, no one has come forward with a solution to the problem.

Accordingly, it may be concluded that the solution to the problem was not obvious to those of ordinary skill in the data center field at the time the present invention was made.

SUMMARY OF INVENTION

The longstanding but heretofore unfulfilled need for an improved apparatus and method for cooling data centers is now met by a new, useful, and nonobvious apparatus for cooling a data center of the type including a plurality of rows of computer racks. The invention includes at least one liquid overfeed air conditioning unit disposed externally to the data center. Each row of computer racks has an aisle on its opposite sides so that data center personnel may walk between the rows. At least one conditioned air supply register is disposed in at least one of the aisles and at least one air conditioning duct provides fluid communication between the heat exchanger outlet of the liquid overfeed air conditioning unit and said at least one register.

In this way, supply air at a temperature of forty-five degrees Fahrenheit or lower is supplied to the interior of the data center by the liquid overfeed air conditioning unit and its associated distribution ducts. Moreover, the flow rate of supply air into the interior of the data center is reduced relative to a flow rate of supply air produced by a chilled water or a direct expansion air conditioning unit due to the increased work capacity of the lower temperature air. Noise reduction within the interior of said data center is therefore achieved and electrical energy is conserved because the liquid overfeed air conditioning system requires less energy relative to a chilled water or a direct expansion air conditioning system.

Each of the computer racks includes a plurality of vertically spaced apart components. The racks are open on their front and back so that conditioned air can flow therethrough from one aisle to another. Circulation fans are mounted so that supply air is drawn into cooling relation to each component through the substantially open front of the rack, flows past the heat-generating equipment, acquiring heat therefrom, and into the aisle adjacent the back of the rack.

The primary object of this invention is to provide an enhanced means for cooling computer components housed in a data center.

A closely related object is to provide efficient means for producing and delivering conditioned supply air to the interior of a data center having a temperature of forty-five degrees Fahrenheit and below.

A more specific object is to cool components housed in a data center with a liquid overfeed air conditioning system.

Additional important objects are to conserve data center floor space, electrical energy and attenuate noise by reducing the flow rate of supply air into a data center, said reduced flow rate being made possible by the reduced temperature of supply air provided by the liquid overfeed air conditioning unit relative to the temperature of supply air provided by chilled water and direct expansion air conditioning units.

Yet another object is to reduce the chances that computer equipment within the data center will be exposed to condensation or frost.

These and other important objects, advantages, and features of the invention will become clear as this description proceeds.

The invention accordingly comprises the features of construction, combination of elements, and arrangement of parts that will be exemplified in the description set forth hereinafter and the scope of the invention will be indicated in the claims.

BRIEF DESCRIPTION OF DRAWINGS

For a fuller understanding of the nature and objects of the invention, reference should be made to the following detailed description, taken in connection with the accompanying drawings, in which.

DETAILED DESCRIPTION

Figure 1:
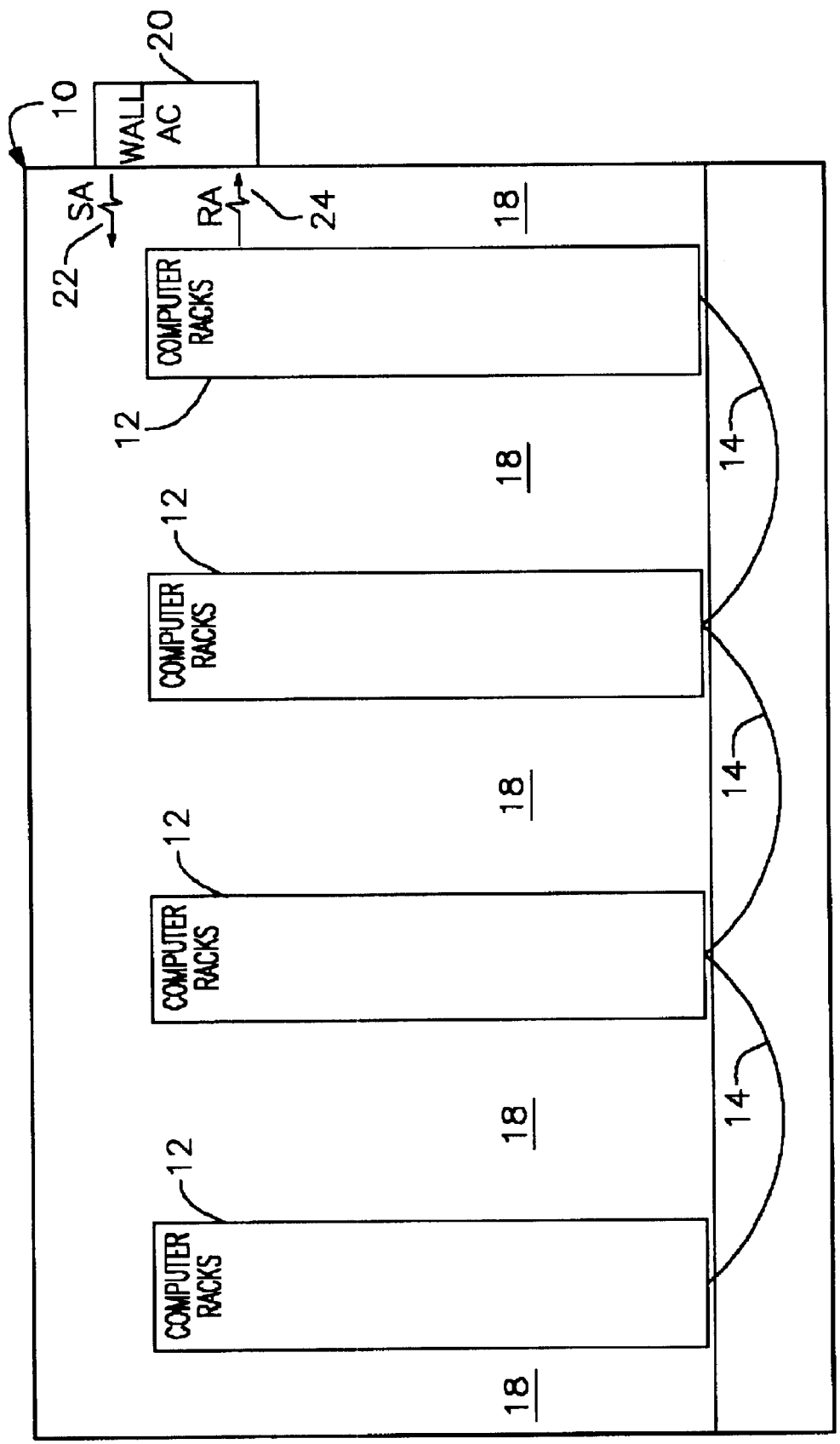
FIG. 1 is a diagrammatic side elevational view of a. prior art data center of the type that relies upon wall DX air conditioning units typically providing supply air temperatures of approximately 55° F. to 60° F.

Referring initially to FIG. 1, it will there be seen that the reference numeral 10 denotes a prior art data center as a whole. A plurality of computer racks, collectively denoted 12, are disposed in equidistantly spaced, parallel rows within data center 10. Cables, collectively denoted 14, provide both high and low voltage to each rack. Advantageously, such cables 14 are positioned beneath a false or raised floor 16, thereby keeping aisles 18 clear so that service personnel can walk between the racks 12 as needed.

A window or wall-mounted air conditioner 20 is provided to perform the cooling function. Cool air is supplied at a supply air outlet as indicated by directional arrow 22 and return air is denoted by directional arrow 24. It is apparent from a cursory inspection of FIG. 1 that the computer racks nearest air conditioner unit 20 will be cooled to a greater extent than the racks furthest from unit 20.

Figure 2:
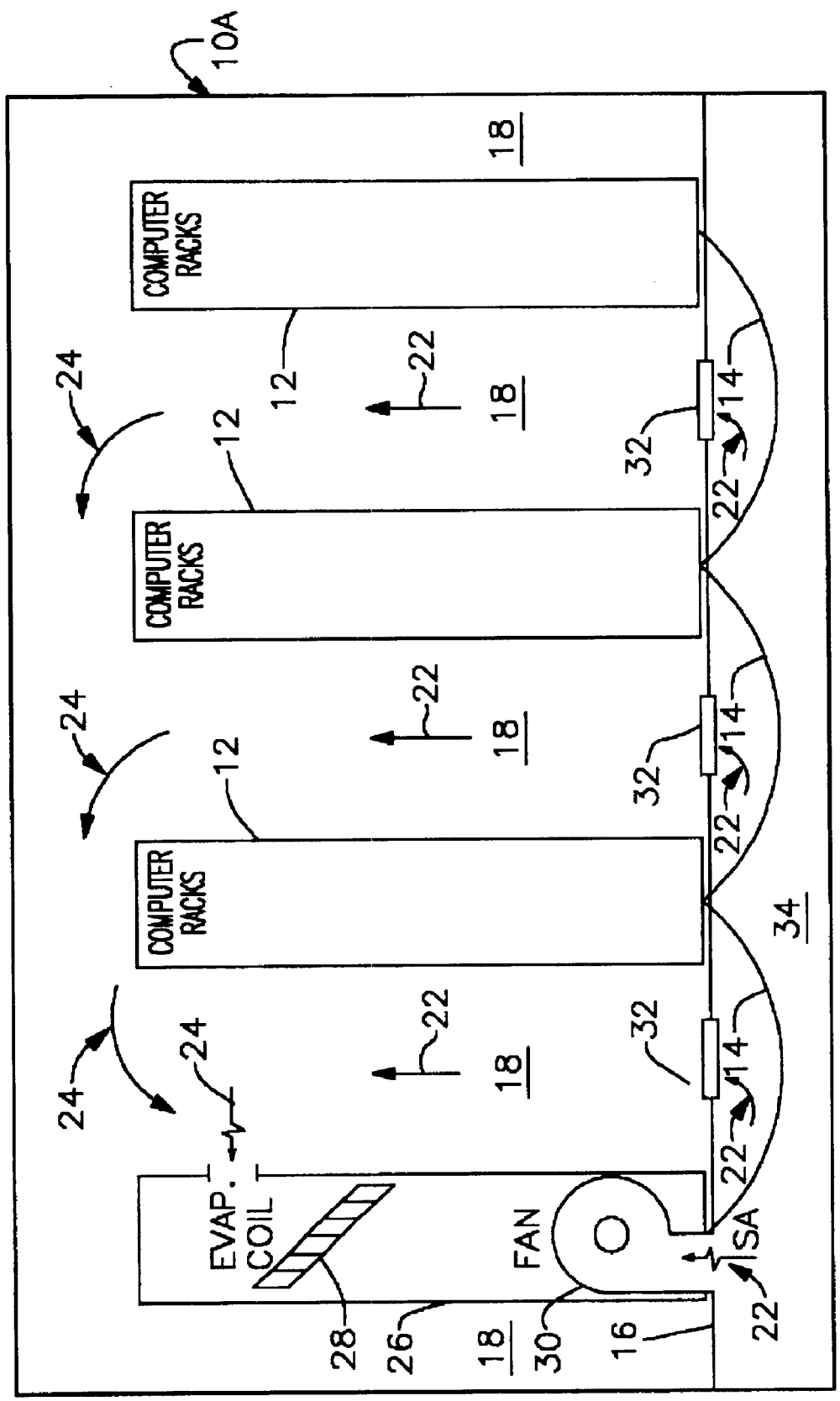
FIG. 2 is a diagrammatic side elevational view of a prior art data center of the type that employs a chilled water or DX system that is mounted within the data center and which typically provides supply air temperatures of approximately 55° F. to 60° F.

FIG. 2 depicts, schematically, a second generation data center 10a. The FIG. 2 data center is currently in widespread use and represents the current state of the art in data centers. Window or wall-mounted air conditioning unit 20 is eliminated and replaced by multiple floor-mounted units 26 having evaporator coil 28 and fan 30.

Air conditioning unit 26 may be of the chilled water or direct expansion type and is capable of delivering supply air 22 at temperatures as low as about fifty-five degrees.

Advantageously, an open-grille grating or floor register 32 is placed in each aisle 18 so that supply air 22 is discharged by fan 30 into space 34 below raised floor 16. Supply air 22 thus escapes from space 34 by flowing through the floor registers, collectively denoted 32. Floor registers 32 are made of a strong material to support service personnel, not shown, who may need to walk in aisles 18 between racks 12 to perform service and maintenance functions. The flow of supply air 22 through floor registers 32 and upwardly between racks 12 of each row is collectively denoted 22 and return air flow to return air register 24 is denoted by directional arrows 24 as in the prior art system of FIG. 1.

The advantages of the FIG. 2 prior art system over the FIG. 1 prior art system are clear. Air conditioning unit 26, which is of the chilled water or direct expansion type as aforesaid, operates at a higher efficiency than a wall or window-mounted unit 20. It also has a longer operating life and is more reliable. Moreover, the utilization of the space below raised floor 16 as a means for delivering cool supply air to each aisle 18 represents a significant improvement over the FIG. 1 system.

However, there are two major drawbacks of the FIG. 2 system. Floor unit 26 supplants at least one computer rack 12, thereby reducing the revenue generated by data center 10a relative to data center 10. Secondly, it provides supply air 22 at about the same temperature provided by the wall or window-mounted air conditioning unit 20. Specifically, as already mentioned, floor unit 26 is a chilled water or direct expansion system; accordingly, the temperature of the supply air is about fifty-five to sixty degrees Fahrenheit (55° F.–60° F.) under optimal climate conditions. Significantly, both chilled water and direct expansion systems employ large amounts of fan brake horsepower. Specifically, the power consumption of a chilled water system is about 1.1 kilowatts per ton and the power consumption of a direct expansion system is about 1.3 kilowatts per ton.

Thus, although the FIG. 2 system represents a significant advance over the FIG. 1 system, the increased power consumption and concomitant heat generation of modern file servers, plus the increased density of such file servers in modern data centers, places maximum stress on FIG. 2 systems. This is the system now in use throughout the world, and such data centers are at a crisis point because their ability to cool has been maximized and the number of heat generating components in racks 12 is increasing as technology advances.

Figure 3:
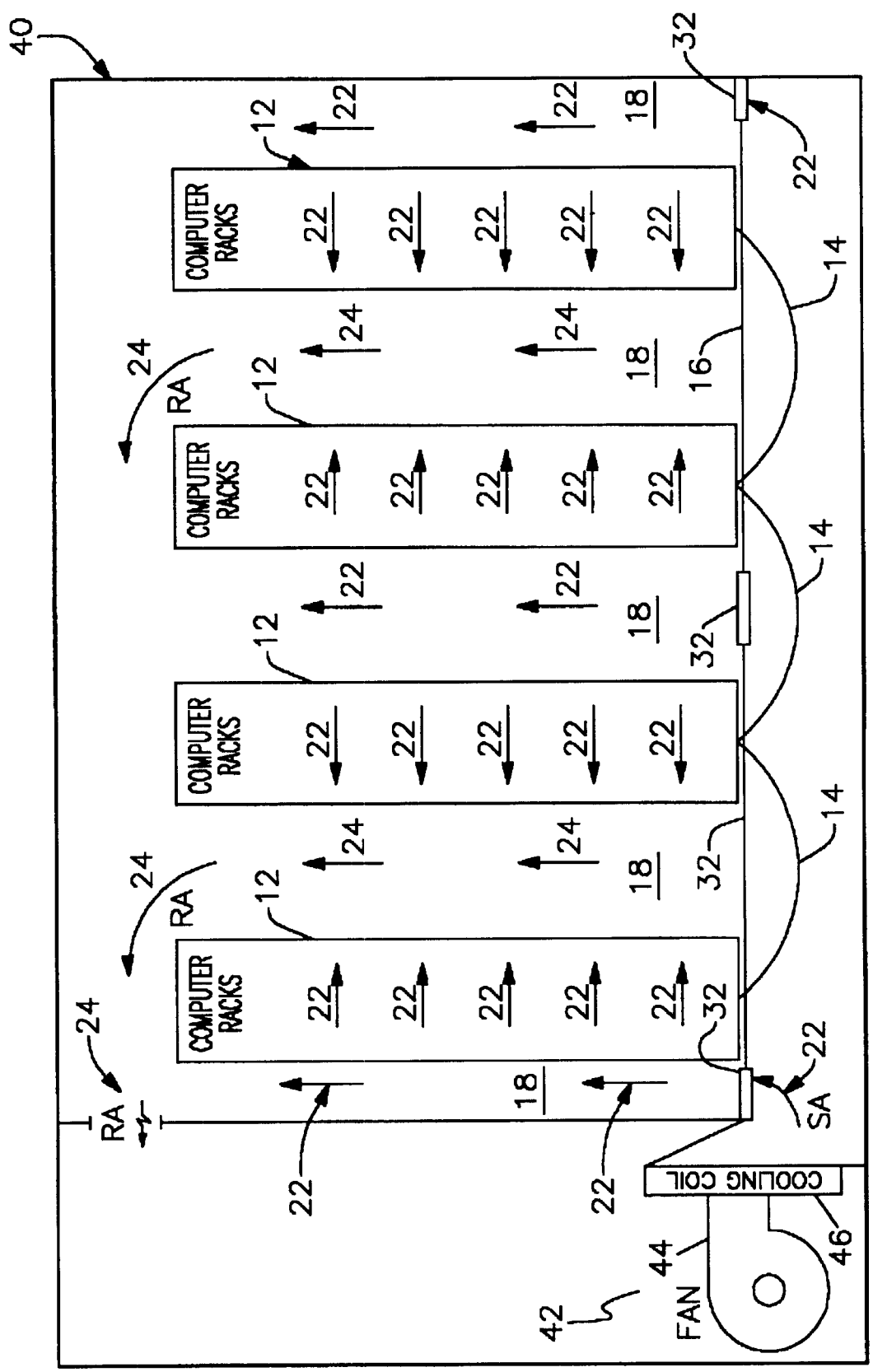
FIG. 3 is a diagrammatic side elevational view of a data center cooled in accordance with the teachings of this invention and which is provided with supply air temperatures of less than 45° F.

The preferred embodiment of the present invention is schematically depicted in FIG. 3 and is denoted by the reference numeral 40 as a whole. It is similar to first generation data center 10 at least to the extent that it provides an external air conditioning unit, here denoted 42 as a whole, and thus does not supplant any computer racks 12 from the data center. It provides a flow of supply air 22 through floor registers 32 that are positioned in every other aisle so that said supply air flows through the racks in the direction indicated by the directional arrows collectively denoted 22. The temperature of supply air produced by unit 42 is much colder than that of the air conditioning units of the prior art data centers.

Unit 42, which includes fan 44 and cooling coil 46, includes a liquid overfeed refrigeration system capable of delivering supply air as cold as thirty-five degrees Fahrenheit (35° F.) in ideal climate conditions. Under some climate conditions, the supply air temperature may be as high as forty-five degrees Fahrenheit (45° F.). This range of 35° F.–45° F. compares favorably with the supply air range of 55° F. –60° F. of chilled water and direct expansion systems.

The provision of supply air 22 at a significantly colder temperature accomplishes the important object of providing a data center that is adequately cooled even when densely packed with modern high power consumption electronic components. It simultaneously enables a significant reduction in brake horsepower of fan 44 because the colder supply air of the FIG. 3 embodiment circulates through the data center at a slower rate than the warmer supply air of the prior art. This accomplishes the objective of reducing the power consumption of a data center air conditioning unit. It also accomplished the objective of reducing the noise within a data center.

Liquid overfeed systems have been used commercially only in those environments requiring intense cold, such as in meatpacking plants and blast freezers. They have not been used in data center applications because the conventional wisdom has been that temperatures below fifty degrees Fahrenheit (50° F.) should be avoided in data centers. It has been thought that sub fifty-degree temperatures could cause static electricity to build up within the data center, could cause condensation or even frost formation, and would prove unacceptably uncomfortable to service and maintenance personnel.

Figure 4:
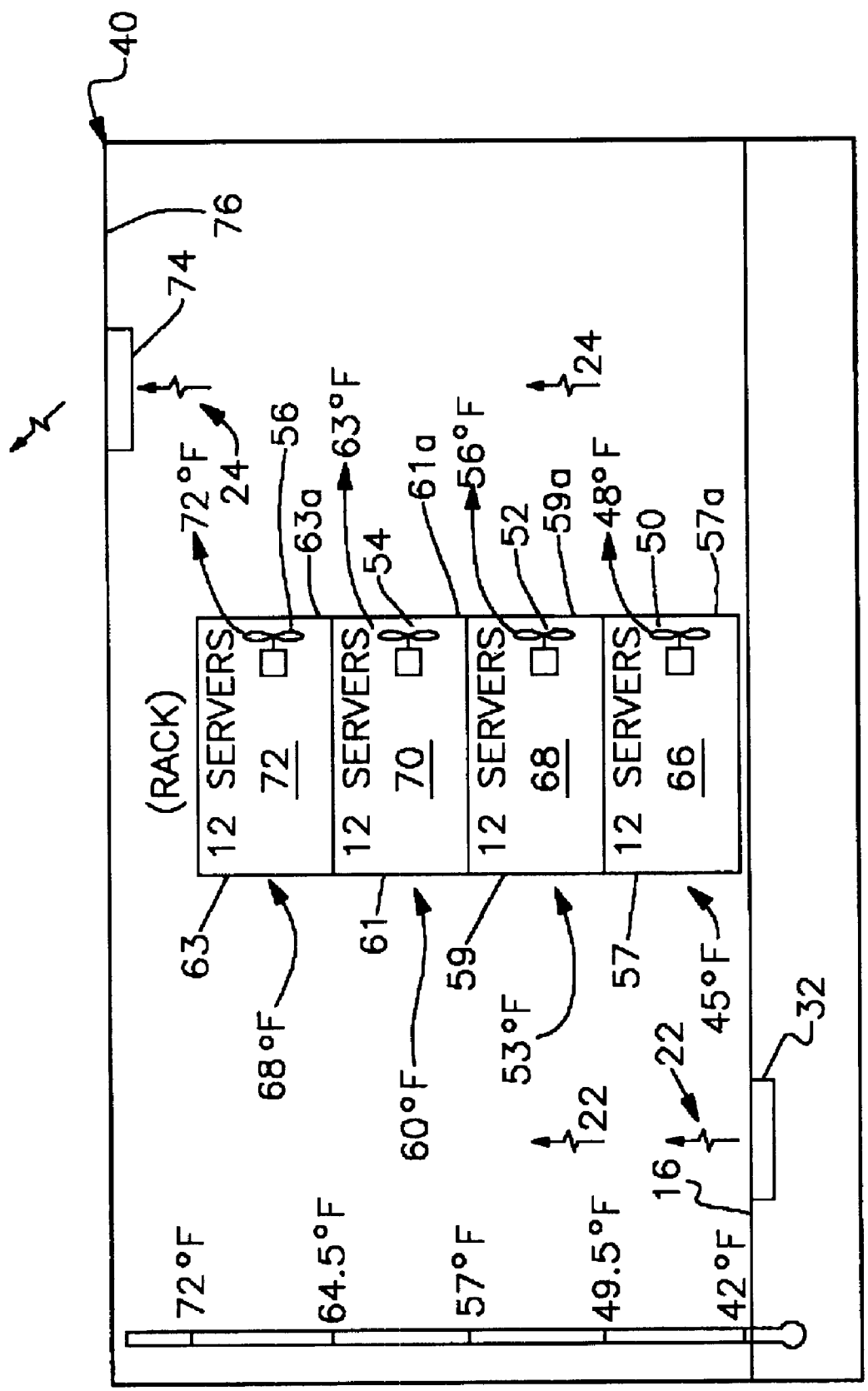
FIG. 4 is a diagrammatic side elevational view showing the interior of a single rack and depicting the temperature gradient at various heights throughout the rack in a typical densely populated data center cooled by the present invention.

These problems have been solved by the structure disclosed in FIGS. 3 and 4. As disclosed in FIG. 4, a small circulating fan, or series of fans, is positioned in air circulating relation to each component in each computer rack 12. In this particular example, supply air 22 at forty-two degrees Fahrenheit (42° F.) flows upwardly through each floor register 32 (positioned in alternate aisles as aforesaid) and is driven by circulating fan 50 into cooling relation to lowermost compartment 66 that is occupied by twelve (12) file servers or other components in this example. Air entering compartment 66 through front opening 57 thereof has a temperature of about forty-five degrees Fahrenheit (45° F.), and the air exiting said compartment through rear opening 57A has a temperature of about forty-eight degrees Fahrenheit (48° F.) due to the heat generated by the twelve (12) servers therein.

Each compartment 66, 68, 70, 72 has an open or substantially open face 57, 59, 61, and 63, respectively, and an open or substantially open back face 57a, 59a, 61a, and 63a, respectively. Supply air drawn sequentially into compartments 66, 68, 70, and 72 by circulating fans 50, 52, 54, and 56, respectively, flows through each of said compartments, cooling the components therein.

Since warm air rises, air flowing out of compartment 66 has been heated by the components therein to about forty-eight degrees Fahrenheit (48° F.). This air-warming process continues as fans 52, 54, and 56 sequentially pull air into their respective compartments 68, 70, 72. Specifically, in this example, air enters compartment 68 at fifty-three degrees Fahrenheit (53° F.) and exits said compartment at fifty-six degrees Fahrenheit (56° F.). It then enters compartment 70 at sixty degrees Fahrenheit (60° F.) and exits said compartment at sixty-three degrees Fahrenheit (63° F.). It flows into upper compartment 72 at sixty eight degrees Fahrenheit (68° F.) and exits said compartment 72 at seventy-two degrees Fahrenheit (72° F.).

Note that fans 50, 52, 54, and 56 recirculate much more air than is supplied by outside unit 42. About ninety per cent (90%) of server ventilation fan 44 is recirculated air from said compartments.

In summary, there is a three or four degree rise in temperature for each circulation of a compartment such as compartments 66, 68, 70, and 72, attributable to heat generated by the components therein. It will also be observed that there is a four or five degree increase in temperature between supply air exiting a compartment and entering the next adjacent compartment disposed upwardly thereof. This gradual rise in temperature is attributed to the fact that the air exiting uppermost compartment 72 is about seventy-two degrees Fahrenheit (72° F.). That relatively warm air flows into return air grill 74. Thus, there is a thirty degree Fahrenheit (30° F.) temperature rise in each of the aisles 18 between contiguous racks 12, i.e., from floor 16 to ceiling 76. The relatively warm air in each aisle thus elevates the temperature of the air as it exits each compartment. Service and maintenance personnel who must enter the data center are therefore not subjected to the intense cold of a meat locker. Furthermore, the rate of supply air flow, expressed in cubic feet per minute (cfm), produced by liquid overfeed unit 42, is slower than that of chilled water and direct expansion systems, thereby further moderating the interior climate of the data center and reducing the noise level therein. Moreover, condensation and frost are not problems and static electricity buildup has not been deemed a significant problem.

Figure 5:
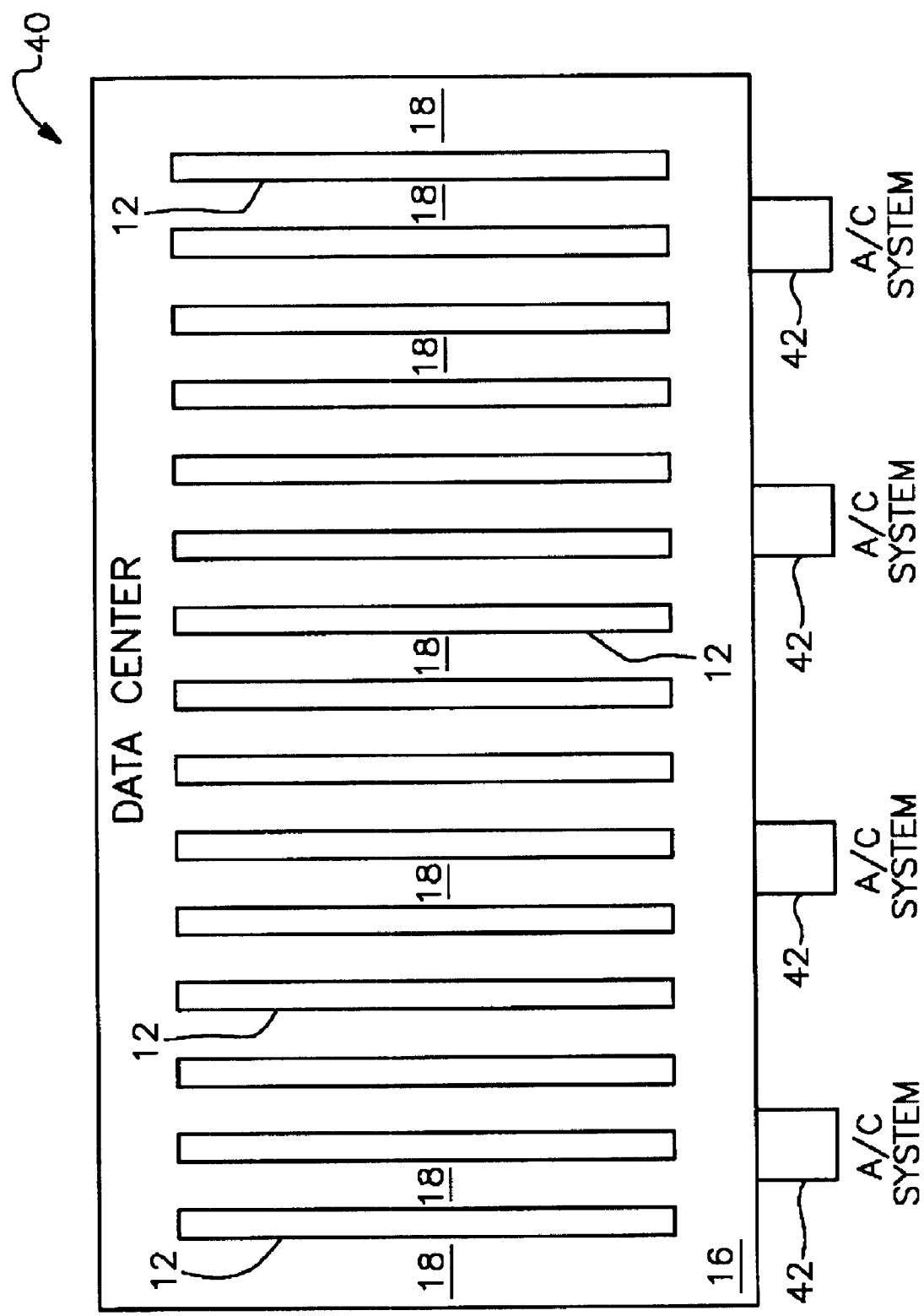
FIG. 5 is a top plan diagrammatic view of a data center cooled by the novel air conditioning method of this invention.

A top plan view of data center 40 equipped with the novel invention is provided in FIG. 5. In this particular example, four liquid overfeed air conditioning units, collectively denoted 42, are mounted outside the center on the ground. However, units 42 could also be roof-mounted. In either case, the ducting has sufficient cross sectional area to avoid any significant pressure drop throughout the length thereof.

This innovative system overcomes a pressing problem faced by today's data centers. It greatly reduces the temperature of the supply air, resulting in a higher temperature differential and increased system efficiency relative to water-cooled or DX cooing systems. This also allows the components to operate at a lower temperature which increases the effective life of such components. The innovative system also conserves energy, reduces noise levels, and does not occupy valuable space within the interior of a data center.

It will thus be seen that the objects set forth above, and those made apparent from the foregoing description, are efficiently attained. Since certain changes may be made in the above construction without departing from the scope of the invention, it is intended that all matters contained in the foregoing description or shown in the accompanying drawings shall be. interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described,

What is claimed is:

1. An apparatus for cooling a data center of the type including a plurality of rows of computer racks, comprising:

at least one liquid overfeed air conditioning unit disposed externally to said data center;

said liquid overfeed air conditioning unit being adapted to supply air at a heat exchanger outlet thereof at a temperature of approximately forty degrees Fahrenheit;

each of said rows of computer racks having an aisle on its opposite sides so that data center personnel may walk between said rows;

at least one supply air register disposed in at least one of said aisles;

at least one air conditioning duct providing fluid communication between said heat exchanger outlet of said liquid overfeed air conditioning unit and said at least one supply air register;

whereby supply air at a temperature of approximately forty degrees Fahrenheit is supplied to an interior of said data center by said liquid overfeed air conditioning unit;

whereby the flow rate of supply air into said interior of said data center is reduced relative to a flow rate of supply air produced by a chilled water or a direct expansion air conditioning unit;

whereby noise reduction within said interior of said date center is achieved; and whereby electrical energy is conserved because said liquid overfeed air conditioning unit requires less energy relative to a chilled water or a direct expansion air conditioning unit.

2. The apparatus of claim 1, wherein each of said computer racks includes a plurality of vertically spaced apart compartments, wherein each of said compartments houses at least one computer component, wherein each of said compartments has a substantially open front and back wall, and wherein a circulation fan is mounted in air circulating relation to each compartment so that said supply air flows into each compartment through said substantially open front wall, flows past said heat-generating equipment, acquiring heat therefrom, and then flows through said substantially open back wall.

3. The apparatus of claim 2, wherein there are a plurality of aisles in said data center and wherein there is at least one supply air register in alternate aisles along an extent of said data center.

* * * * *